(12) United States Patent
Kim

(10) Patent No.: US 10,847,671 B2
(45) Date of Patent: Nov. 24, 2020

(54) UNIT PIXEL OF IMAGE SENSOR AND LIGHT-RECEIVING ELEMENT THEREOF

(71) Applicant: Hoon Kim, Seoul (KR)

(72) Inventor: Hoon Kim, Seoul (KR)

( * ) Notice: Subject to any disclaimer, the term of this patent is extended or adjusted under 35 U.S.C. 154(b) by 0 days.

(21) Appl. No.: 16/709,911

(22) Filed: Dec. 10, 2019

(65) Prior Publication Data

US 2020/0119218 A1    Apr. 16, 2020

Related U.S. Application Data

(62) Division of application No. 15/885,757, filed on Jan. 31, 2018.

(51) Int. Cl.
| *H01L 27/30* | (2006.01) |
| *H01L 31/113* | (2006.01) |
| *H01L 31/0232* | (2014.01) |
| *H01L 31/036* | (2006.01) |
| *H01L 27/146* | (2006.01) |

(52) U.S. Cl.
CPC ...... *H01L 31/1136* (2013.01); *H01L 27/1461* (2013.01); *H01L 31/02322* (2013.01); *H01L 31/02327* (2013.01); *H01L 31/036* (2013.01); *H01L 31/113* (2013.01); *H01L 27/146* (2013.01); *H01L 27/14679* (2013.01)

(58) Field of Classification Search
None
See application file for complete search history.

(56) References Cited

U.S. PATENT DOCUMENTS

2013/0056708 A1*  3/2013  Kim .................. H01L 27/14612
257/30

* cited by examiner

*Primary Examiner* — Joseph C. Nicely
*Assistant Examiner* — Lamont B Koo
(74) *Attorney, Agent, or Firm* — Renaissance IP Law Group LLP

(57) ABSTRACT

Provided are a light-receiving element which has more capability of detecting wavelengths than that of existing silicon light-receiving elements and a unit pixel of an image sensor by using it. The light-receiving element includes: a light-receiving unit which is floated or connected to external voltage and absorbs light; an oxide film which is formed to come in contact with a side of the light-receiving unit; a source and a drain which stand off the light-receiving unit with the oxide film in between and face each other; a channel which is formed between the source and the drain and forms an electric current between the source and the drain; and a wavelength expanding layer which is formed in at least one among the light-receiving unit, the oxide film and the channel and forms a plurality of local energy levels by using strained silicon.

10 Claims, 12 Drawing Sheets

UNIT PIXEL OF IMAGE SENSOR AND LIGHT-RECEIVING ELEMENT THEREOF

CROSS-REFERENCE TO RELATED APPLICATION

This application is a divisional of U.S. patent application Ser. No. 15/885,757, filed Jan. 31, 2018.

1. Technical Field

The present disclosure relates to a unit pixel of an image sensor and a light-receiving element thereof, more particularly to a light-receiving element with expanded light-absorbing wavelengths by splitting energy levels of silicon and a unit pixel of an image sensor using the light-receiving element.

2. Description of the Related Art

An image sensor converts an optical signal into an image signal, which, when light is radiated onto a light-receiving unit inside a unit pixel of an image sensor chip, detects the light and its quantity incident upon each of the unit pixels, thereby converting a photosignal to generate an electrical signal and then transfers the electrical signal to an analog circuit unit and a digital circuit unit to form an image.
Existing image sensors can be categorized largely into charged coupled device (CCD)-type and complementary metal oxide semiconductor (CMOS)-type depending on their configuration and operational principles. The image sensor of CMOS-type is commonly called CMOS image sensor (CIS).

The image sensor of CCD-type transmits a signal electron group generated by light in each of the pixels to an output unit by means of a pulse applied to a gate, converts the group into voltage at the output unit and puts out the group in turn. On the other hand, the image sensor of CMOS-type converts signal electrons and holes generated by light in each of the pixels into voltage inside the pixel while the voltage is connected to a signal processing unit such as decoders of each column and row and put out of the pixel by switching operation according to clock frequencies.

On the other hand, the image sensors can be categorized into active pixel sensors (APSs) and passive pixel sensors (PPSs) depending on whether there exists an amplifier in the unit pixel.

Whereas the PPS, as a passive device which has no signal amplification function in the pixel, outputs the current of the light-receiving element directly towards its outside, thereby converting the current into voltage outside the pixel, the APS is an active pixel which has a voltage signal amplification function inside the pixel.
Since the PPS is generally composed of a single photodiode and a single selection transistor, the PPS has advantageous effects of increasing the aperture ratio and growing the fill factor, which is related to the light-receiving efficiency compared with the APS, which requires three to five MOS transistors for an identical pixel size.

On the contrary, the PPS has photocurrent with low intensity and converts the photosignal into the form of current, which is vulnerable to the external environment such as noise to use for signal processing, which accounts for its disadvantageous effect of generating fixed-pattern noise (FPN).

Therefore, for an identical size of the pixel, the APS can obtain the image signal which has less noise than that of the PPS because the APS has a plurality of the transistors in its unit pixel, although the light-receiving unit of the APS gets smaller than that of the PPS in terms of the size of the light-receiving unit.

Meanwhile, an electron-hole pair (EHP) is generated against a photon incident from the light-receiving unit of the unit pixel of the image sensor while the generated electrons and holes are accumulated in the photodiode, which is the light-receiving unit.

The maximum electrostatic capacity that can be accumulated in the photodiode is proportional to its light-receiving area. In particular, it is physically limited to enlarge the light-receiving area of the CMOS image sensor in that the CMOS image sensor has an area for arranging the transistors accompanying the CMOS sensor larger than that of the CCD image sensor. In the meantime, the photodiode used mainly as the light-receiving unit of the image sensor has relatively small electrostatic capacity, and therefore, is easily saturated and not easily subdivided in an analog way.

As a result, the unit pixel of the CMOS image sensor requires a relatively long period for accumulating photocharges so as to generate the minimum charge for processing signals through the limited light-receiving area. Thus, the unit pixel having such a light-receiving unit is not suitable for the image sensor with a high-density/high-speed frame.

The band gap of silicon semiconductors is 1.12 eV and such silicon semiconductors can detect light energy of which wavelength ranges from 400 to 1,100 nm when used as the light-receiving element. In other words, such silicon semiconductors cannot detect light of which wavelength is 400 nm or less or 1,100 nm or more and are not applied to any sensors for biometrics, motion recognition and the like, which make use of near infrared or infrared rays, despite their economic efficiency.

SUMMARY

To resolve the problems, the present disclosure provides the light-receiving element and the unit pixel of the image sensor with expanded light-absorbing wavelengths by forming strained silicon in an area including the light-receiving unit which light enters, thereby efficiently splitting energy level of silicon.

To achieve the objectives, an embodiment of the present disclosure provides the light-receiving element, including:
the light-receiving unit which is structured to be floated and absorbs light;
an oxide film which is formed to come in contact with a side of the light-receiving unit;
a source and a drain which stand off the light-receiving unit with the oxide film in between and face each other;
a channel which is formed between the source and the drain and forms an electric current between the source and the drain; and
a wavelength expanding layer which is formed in at least one among the light-receiving unit, the oxide film and the channel and forms a plurality of local energy levels,
wherein the light-receiving unit is electrically insulated from the source and the drain by means of the oxide film;
electrons excited when light is received flow into the light-receiving unit under the tunneling effect when at least one among the local energy level conditions is met; and
the electric current along the channel is controlled according to change of electric charge quantity in a gate or the light-receiving unit with the inflow of the electrons.

Here, the light-receiving element can be formed on a silicon substrate in which first-type impurities are doped.

Here, the source and the drain are formed on a well in which second-type impurities are doped, wherein the well can be floated.

Here, the wavelength expanding layer is formed including strained silicon and can split the energy levels of the conduction band and the valence band according to the direction of the crystal lattice planes of silicon.

Here, the light-receiving element can include a plurality of the wavelength expanding layers, which are different from each other in terms of at least one of their formation location and manufacturing process.

Here, the wavelength expanding layer can be formed by applying stress onto silicon and the interface of the oxide film.

Here, the wavelength expanding layer can be formed by bonding heteroatoms to or injecting ions into a silicon crystal which forms the light-receiving unit or the channel.

Here, the size of the light-receiving unit can correspond to a de Broglie wavelength of an electron.

Here, the light-receiving unit can further include a terminal which applies gate voltage to the light-receiving unit so as to control the threshold voltage and output signals by controlling the gap between the Fermi level and the intrinsic level of the channel.

Here, the tunneling can occur in an oxide film zone between any one of the channel and the drain and the light-receiving unit.

An embodiment of the present disclosure provides the unit pixel of the image sensor, including:

the light-receiving element which generates an electric current by using change of electric charge quantity caused by incident light; and a reset element which removes residual electric charges from the light-receiving element, wherein the light-receiving element includes:
the light-receiving unit which is structured to be floated and absorbs light;
the source and the drain which stand off the light-receiving unit with the oxide film in between;
the channel which is formed between the source and the drain and forms an electric current between the source and the drain; and
the wavelength expanding layer which forms a plurality of local energy levels,
and controls the electric current along the channel based on change of electric charge quantity in the light-receiving unit while electrons excited when light is received flow into the light-receiving unit under the tunneling effect when at least one among the local energy level conditions is met.

Here, the reset element can remove residual charges from a diffusion well where the light-receiving element is formed.

Here, the diffusion well can remain floated while the light-receiving element operates.

Here, the reset element of the unit pixel of the image sensor is connected to a diffusion layer in which the first-type impurities are doped in high density on the diffusion well in which the first-type impurities are doped.

Here, the wavelength expanding layer is formed including strained silicon and can split the energy levels of the conduction band and the valence band according to the direction of crystal lattice planes of silicon.

Here, the light-receiving element can include the light-receiving unit which corresponds to a de Broglie wavelength.

An embodiment of the present disclosure provides the unit pixel of the image sensor, including:

the light-receiving element which generates an electric current by using change of electric charge quantity caused by incident light;

a selection element which outputs the electric current generated in the light-receiving element to a unit pixel out; and the reset element which removes residual electric charges from the light-receiving element, wherein the light-receiving element includes:
the light-receiving unit which is structured to be floated and absorbs light;
the source and the drain which stand off the light-receiving unit with the oxide film in between;
the channel which is formed between the source and the drain and forms an electric current between the source and the drain; and
the wavelength expanding layer which forms a plurality of local energy levels, and controls the electric current along the channel based on change of electric charge quantity in the light-receiving unit while electrons excited when light is received flow into the light-receiving unit under the tunneling effect when at least one among the local energy level conditions is met.

Here, the selection element includes:
the source and the drain which are connected to the light-receiving element and the unit pixel out, respectively; and
the gate to which selection signals are applied from the outside,
and can perform switching operation on the basis of the applied selection signals.

Here, the wavelength expanding layer is formed including strained silicon and can split the energy levels of the conduction band and the valence band according to the direction of crystal lattice planes of silicon.

Here, the light-receiving element can include the light-receiving unit which corresponds to a de Broglie wavelength.

According to the various embodiments of the present disclosure, the unit pixel of the image sensor can be manufactured which can detect light energy of which wavelengths are expanded compared with those of conventional silicon-based image sensors.

Moreover, a separate manufacturing process is not necessary for photodiodes for the unit pixel as in the general CCD- or CMOS-type image sensors, thereby significantly reducing the size of the unit pixel of the image sensor. In addition, according to the present disclosure, it is possible to fabricate, by employing common MOSFET manufacturing processes, the light-receiving element which can output a considerable intensity of photocurrent from relatively small quantity of light.

DETAILED DESCRIPTION

Embodiments according to the present disclosure will be described in more detail hereinafter with reference to the accompanying drawings. In describing the present disclosure, any known technique will not be described in detail when it is determined such description can unnecessarily make the subject matter of the present disclosure obscure. Any number used in describing the present disclosure such as a first, a second and the like is nothing but an identifier for distinguishing one element from another one.

In addition, in the present Specification, when it is specified one element "is connected to" or "comes in contact with" another one, whereas the former element can be directly connected to or come in contact with the latter, it should be understood the two are possibly connected or come in contact with each other with still another element in between as a medium unless otherwise contradictorily specified.

Figure 1:
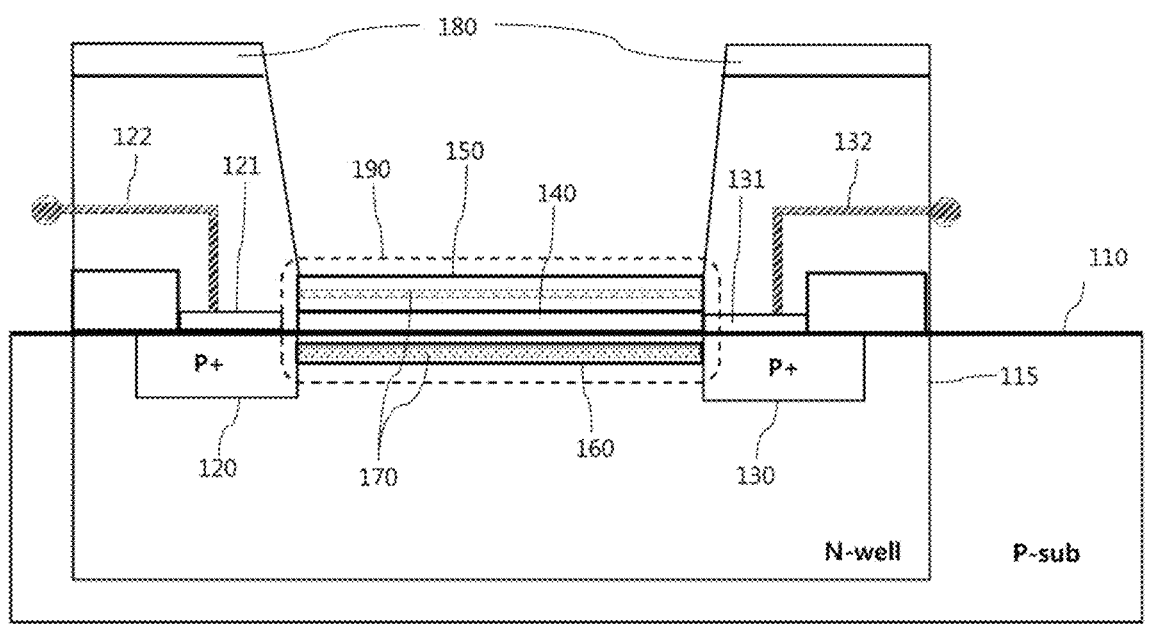
FIG. 1 is a cross-sectional view of the tunnel junction light-receiving element according to an embodiment of the present disclosure.

FIG. 1 is a cross-sectional view of the tunnel junction light-receiving element according to an embodiment of the present disclosure.

In FIG. 1, the light-receiving element corresponds to the unit pixel and is achieved by using a tunnel junction element other than existing photodiodes, wherein the tunnel junction element is a structure for which a thin insulating layer is bound between two conductors or semiconductors, referring to an element which operates by the tunneling effect which occurs in the insulating layer. Just for information, the tunneling effect is one of quantum mechanical effects, meaning a phenomenon that a particle which moves under exertion of force having potential passes through an area of which potential energy is larger than the kinetic energy of the particle itself.

The tunnel junction light-receiving element can be achieved according to an embodiment of the present disclosure in various structures. Although, as nonrestrictive examples, the element can be formed in the structure of n-MOSFET (metal-oxide-semiconductor field-effect transistor) or p-MOSFET, the element can use other structures of electronic elements such as JFET or JUGFET (junction gate field-effect transistor), HEMT (High-electron-mobility transistor) and the like, which can obtain the tunneling effect. The tunnel junction light-receiving element 100 according to an embodiment of the present disclosure is achieved in the structure of a PMOS. The tunnel junction light-receiving element 100 includes an N-type well 115 formed on a P-type substrate 110 and further includes the P+ diffusion layer 120 which corresponding to the source of a common PMOS electronic element and the P+ diffusion layer 130 which corresponds to the drain thereof. The P+ diffusion layers 120, 130 are fabricated by injecting high-density P-type impurities on the N-type well 115. The P+ diffusion layers 120, 130 will be referred to as the source and the drain, respectively, hereinafter.

Formed on the source 120 and the drain 130 are metallic contacts 121, 131, which are connected to external nodes. The metallic contact 121 of the source 120 is connected to the outside via a metallic line 122. Likewise, the metallic contact 131 of the drain 130 is connected to the outside via the metallic line 132. Unlike the common PMOS electronic elements, the N-type well 115 is formed in a floating structure and only the source 120 and the drain 130 are connected to the external nodes, which accounts for the difference between them in terms of structure.

In the silicon area between the source 120 and the drain 130 is formed the channel 160 through which electric charges migrate while above the channel 160 is formed the thin oxide film 140. The source 120 and the drain 130 stand off the polysilicon gate 150 with the oxide film 140 in between and face each other. It is desirable to form 10 nm or less of the oxide film 140 in thickness for the sake of generating the tunneling effect, but not limited thereto.

On the oxide film 140 is formed the polysilicon gate 150, corresponding to the gate of the PMOS electronic elements, in which P- or N-type impurities are doped. Unlike the gate of the common PMOS electronic elements, the polysilicon gate 150 can have a floating structure. In addition, the upper portion of the polysilicon gate 150 is an area which absorbs light and any metallic silicide oxide layer is not formed therein for the upper portion to operate. The polysilicon gate 150 will be referred to as the "light-receiving unit" hereinafter.

Absorbed light has influence on the light-receiving unit 150 and the oxide film 140 and the channel 160 as well. Therefore, the light-receiving unit 150, the oxide film 140 and the channel 160 are referred to as a "light-absorbing layer".

The N-type well 155 has a floating structure. Since the N-type well 115 is floated, it is easier to detect change of electric charge quantity generated by incident light in the light-receiving unit 150.

The tunnel junction light-receiving element 100 can include a light-shielding layer 180. Being formed on the tunnel junction light-receiving element 100 save for the light-receiving unit 150, the light-shielding layer 180 shields light from being absorbed in an area other than the light-receiving unit 150, which is for photocharges in the light-absorbing layer 190 to tunnel efficiently. The light-shielding layer 180 can be formed by a silicide and/or metal process while a mask can prevent the light-shielding layer 180 from being formed on the light-receiving unit 150 in its upper portion.

An electric field is formed between the source 120, the drain 130 and the light-receiving unit 150 while the channel 160 is formed between the source 120 and the drain 130 by light incident upon the light-receiving unit 150 when light is radiated onto the tunnel junction light-receiving element 100. More specifically, EHPs are generated by light incident upon the light-absorbing layer 190. In other words, when light having energy larger than the band gap or the energy to bind the doped impurities is radiated onto each of the light-absorbing layers 190, which means light of which energy is larger than the band gap or the energy to bind the doped holes is radiated onto the light-receiving unit 150 and the channel 160 with the oxide film 140, which shuts out movement of charges in their equilibrium, as a boundary, a plurality of EHPs are generated and the charges come into their free state.

At this point, the formed EHPs exist for a certain period as electrons and holes separately before they are recombined, which leads to a local increase of the number of electrons, and therefore, of charge quantity. Such separated, or excited, electrons move freely outside the grain boundary of the light-receiving unit 150 and, as a result, the electrons are accumulated in proximity to the boundary of the light-receiving unit 150 to come under the influence of the electric field. As the number of the connected electrons increases, the electric field gets intensified, which accelerates the electron accumulation in proximity to the boundary of the light-receiving unit 150. As seen this phenomenon, when incident light is more intense, more EHPs are generated and a more intense electric field is generated.

After that, the excited electrons flow from the drain 130 and the channel 160 and the like into the light-receiving unit 150 by the tunneling effect of the oxide film 140 when the energy level conditions are met. Therefore, the light-receiving unit 150 changes in terms of its total charge quantity. In other words, because the charge quantity of the channel 160 increases the same as the number of electrons flowing in by the tunneling effect, by the effect of threshold voltage modulation according to the change of the charge quantity of the light-receiving unit 150 by means of the electron inflow, conductance of the channel 160 changes between the source 120 and the drain 130 and a current corresponding to the changed conductance flows.

At this point, according to an embodiment of the present disclosure, the wavelength expanding layer 170 is formed, which expands the wavelengths the tunnel junction light-receiving element 100 absorbs by forming a plurality of local energy levels in the light-absorbing layer 190 including the light-receiving unit 150. The wavelength expanding layer 170 includes the strained silicon layer caused by applying stress to or injecting ions into the light-receiving unit 150, the interface of the oxide film 140 or the interface of the substrate (or the channel 160) and, unlike conventional silicon, can detect light of wavelengths common silicon photodiodes cannot detect because it generates a plurality of the local energy levels by splitting each energy level of the valence band and the conduction band.

Figure 2A:
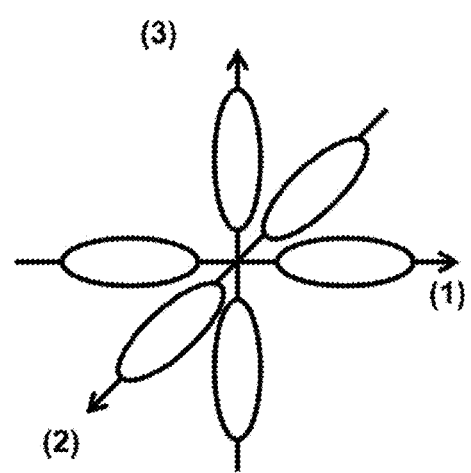
FIG. 2a illustrates the energy band of a common silicon single crystal.
Figure 2A:
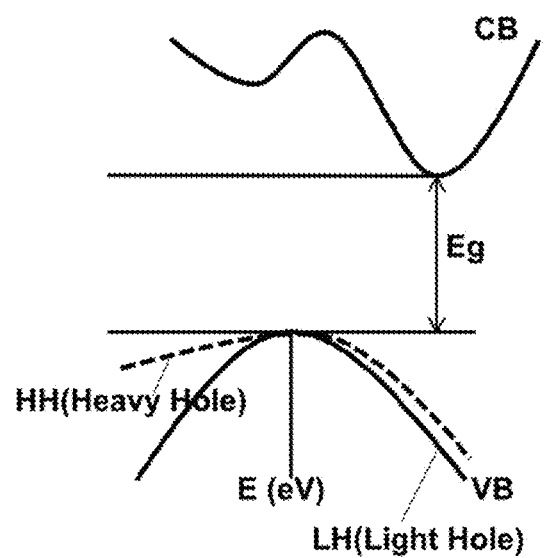
Figure 2B:
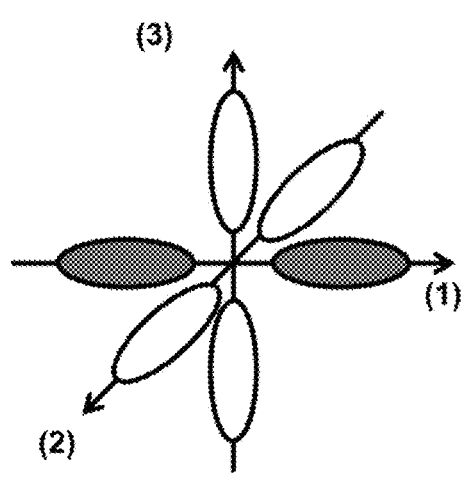
FIG. 2b illustrates the energy band of strained silicon; and the FIG. 2c illustrates the energy band of the common silicon crystal and the strained silicon, comparing them.
Figure 2B:
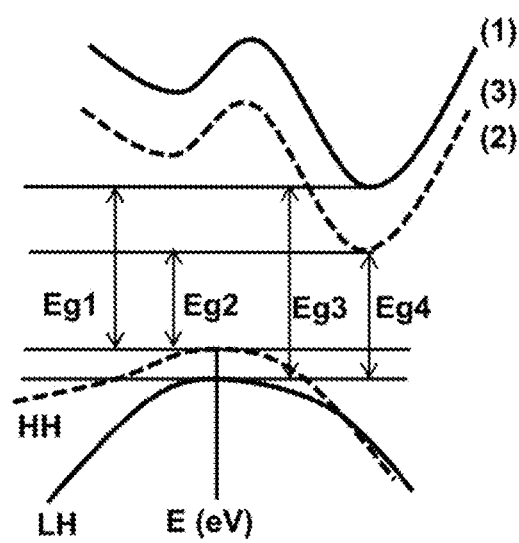
Figure 2C:
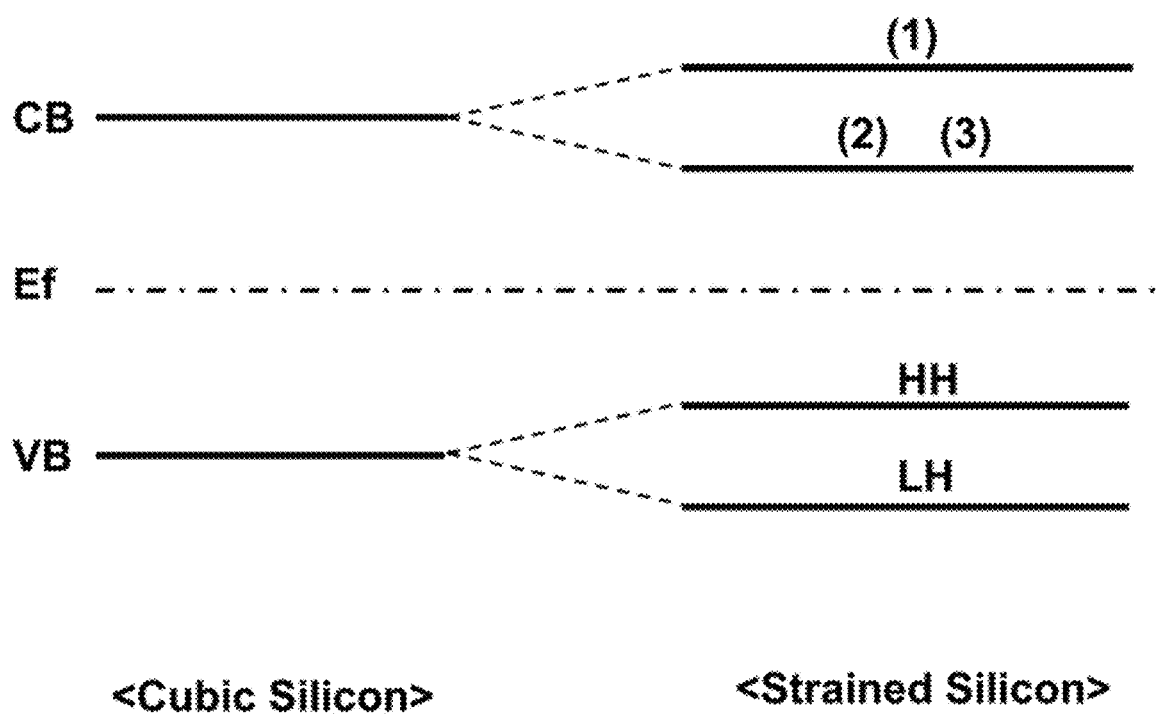

FIG. 2a illustrates the energy band of a common silicon single crystal; FIG. 2b illustrates the energy band of strained silicon; and the FIG. 2c illustrates the energy band of the common silicon crystal and the strained silicon, comparing them.

For information, the crystal direction of a silicon single crystal is determined as (1), (2), (3) and the like according to its lattice arrangement. As a result, in its energy band, the lowest level of the conduction band (CB) does not correspond to the highest level of the valence band (VB) in the k-space. Therefore, the electron excited by light is a material in the indirect transition mode which should employ a phonon as a medium. Single crystal silicon shows infinitesimal spin-orbit interaction, and, therefore, the split-off bands (spin splitting bands) to heavy holes (HH) and light holes (LH) bands are similar to each other in the sense of energy ($\Delta$=44 meV). Thus, as illustrated in FIG. 2a, the band gap energies of common single crystal silicon have an identical value (Eg=1.12 eV). In strained silicon, however, the energy level is split to HHs and LHs of the CB. Accordingly, the CB shows, as illustrated in FIG. 2b, the local energy levels generated based on the crystal directions, (1), (2) and (3). Since the band gap energies, Eg1, Eg2, Eg3 and Eg4, according to the split energy levels are different from the existing band gap energy, Eg, the wavelength of the light energy detected in the strained silicon layer expands the wavelength of the light energy detected in the common silicon layer. In short, in FIG. 2b, four light energies can be absorbed.

Meanwhile, it is assumed the strained silicon is formed by applying uniaxial tensile stress to a single crystal silicon. Besides, the wavelength expanding layer 170 in which the strained silicon is formed can be fabricated according to many techniques. As a nonrestrictive example, the wavelength expanding layer 170 can be fabricated by applying stress to the surface of the oxide film, polysilicon and/or substrate (or the channel area), binding heteroatoms (for example, germanium, Ge) or injecting ions (for example, phosphorus, P, boron, B, nitrogen, N, gallium, Ga and the like). Furthermore, the strained silicon can be formed by controlling stress for heat treatment by increasing the dopant density of the oxide film, polysilicon and/or substrate.

In particular, when the size of the light-absorbing layer 190 decreases, the energy levels per area of the local energy levels formed in the wavelength expanding layer 170 get involved more aggressively in the process of electron excitation. In a PN junction diode as the light-receiving element of the common image sensor, it is advantageous to enlarge the area onto which light is radiated because the area of the light-absorbing layer has direct influence on its light-receiving efficiency. On the contrary, in the tunnel junction light-receiving element 100 of the present disclosure, the light-absorbing layer with a lesser area can detect light energy with wider wavelengths, which accounts for an advantageous effect of the present disclosure.

Two of the wavelength expanding layers 170 are illustrated in FIG. 1. However, FIG. 1 just shows an example of the present disclosure. The tunnel junction light-receiving element 100 can control the light-absorbing peak wavelength by changing local energy levels and split states by modifying the number of the wavelength expanding layer 170, its location, its fabricating process and the like. For example, it is possible to detect light energy with more wavelengths by increasing the number of the states of local energy levels by forming a plurality of the wavelength expanding layers and modifying the fabricating process of each of the wavelength expanding layers. It can be experimentally determined in the fabricating process according to the various characteristics of the light-receiving element.

Figure 3:
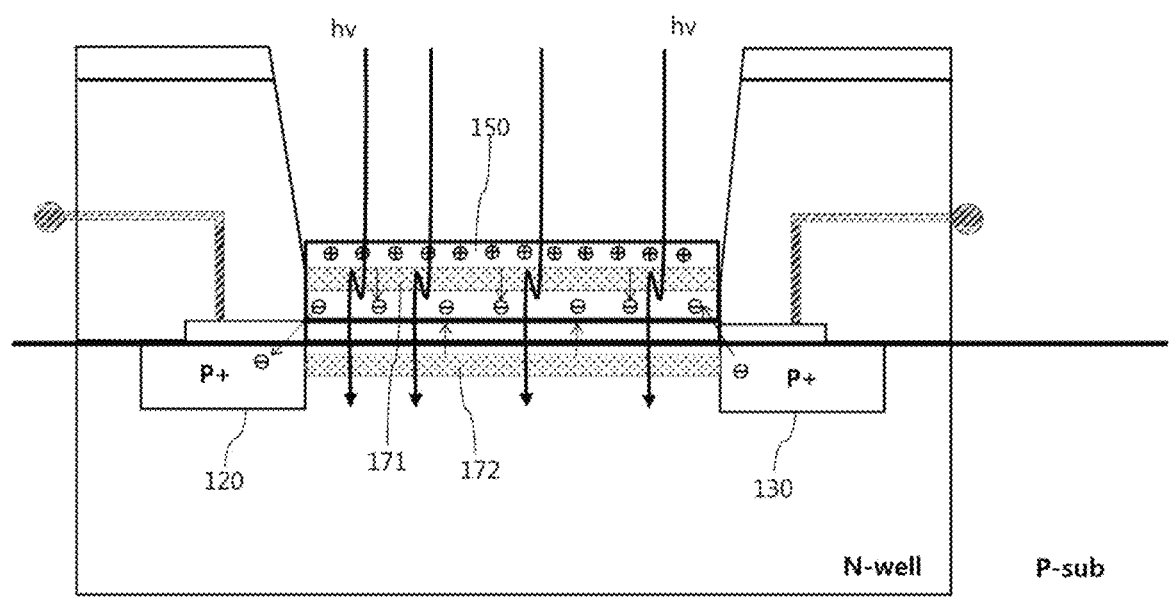
FIG. 3 illustrates an example where the wavelength expanding layer is formed in the light-receiving unit and the channel according to an embodiment of the present disclosure.

FIG. 3 illustrates an example where the wavelength expanding layer is formed in the light-receiving unit and the channel according to an embodiment of the present disclosure. Referring to FIG. 3, the electrons excited in the wavelength expanding layer 171, 172 when light enters the wavelength expanding layer 171, 172 migrate to at least one among the oxide film 140, the interface of the channel 160 and the drain 130 and flow into the light-receiving unit 150 when at least one among a plurality of the local energy level conditions is met. At this point, because driving voltage is applied to the drain 130, the electrons continuously flow into the light-receiving unit 150 after tunneling through the oxide film 140. Therefore, the tunnel junction light-receiving element 100 does not require an independent amplifying element to amplify signals.

Meanwhile, the channel 160 is designed during the fabricating process of the tunnel junction light-receiving element 100 in order for the channel 160 to be a state immediately before pinch-off. The channel 160 is formed due to the voltage difference between the source 120 and the drain 130 while a depletion layer is formed around the source 120, the drain 130 and the channel 160. In order to be immediately before pinch-off without applying external voltage to the source 120 and the drain 130, the channel 160 is fabricated by controlling the W/L ratio, the ratio of its width to its length. The W/L ratio can be, as a nonrestrictive example, ½.

In addition, the size of the light-receiving unit 150 can be used for controlling the wavelengths of absorbed light as the light-receiving layer which includes the strained silicon does. As described above, as the light-receiving unit (and/or the light-absorbing layer) has a lesser area, the size of the electric field increases between the source 120, the drain 130 and the light-receiving unit 150. This leads to an increase of the probability for photoexcited electrons to tunnel through the oxide film then from resultant photocurrent, which increases the photoelectric conversion efficiency. In particular, when the size of the light-receiving unit 150 is designed so that the size corresponds to quantum mechanical confinement of electrons, the energy of electrons and holes inside the light-receiving unit becomes no longer continuous as in three-dimensional space, by the quantization effect, but quantized so that their energy levels are split with certain intervals in between.

Figure 4:
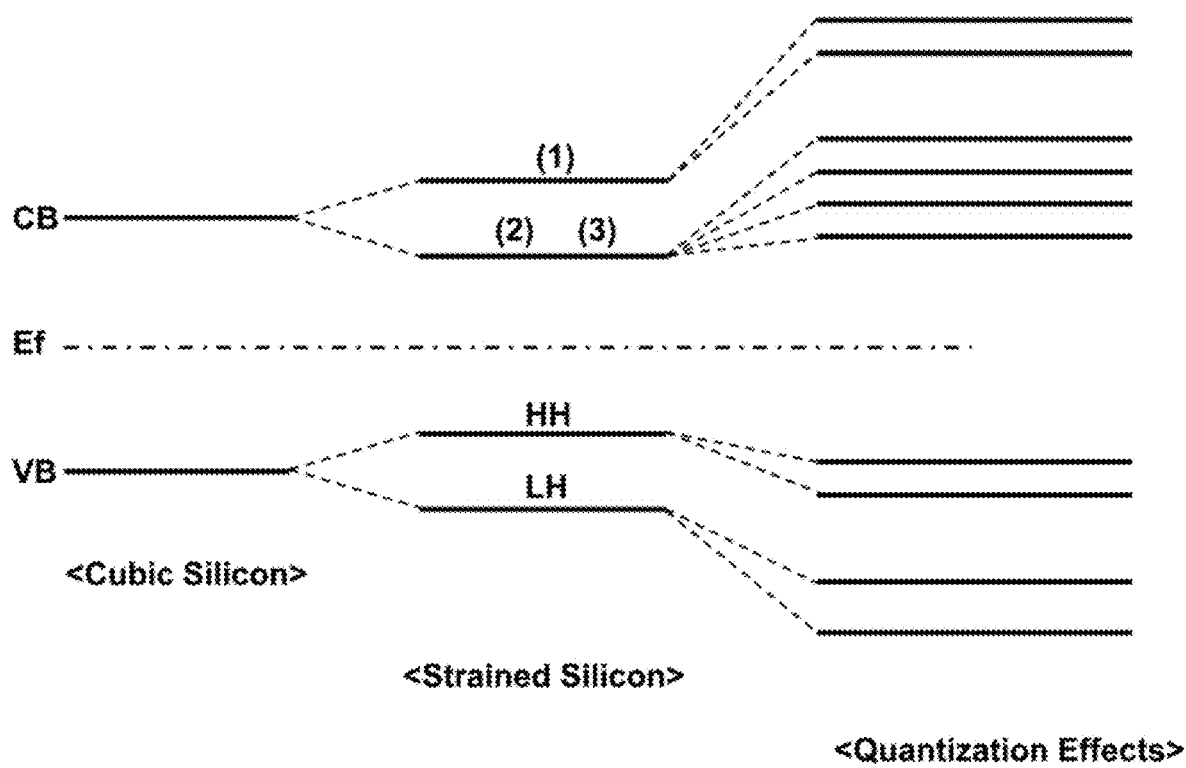
FIG. 4 illustrates an example where energy levels are split when the size of the light-receiving unit corresponds to the quantum mechanical confinement of electric charges according to an embodiment of the present disclosure.

FIG. 4 illustrates an example according to an embodiment of the present disclosure where energy levels are split when the size of the light-receiving unit is affected by quantum mechanical confinement of electric charges. Referring to FIG. 4, the energy levels of silicon are split by the strained silicon in the wavelength expanding layer while each of the split energy levels is further split at an interval of a certain value of energy by quantization caused by the quantum mechanical size effect. Accordingly, effective signals can be detected from light with more wavelengths.

Here, in the description above, that the light-receiving unit is fabricated so that it corresponds to quantum mechanical confinement of electric charges includes a case where the size of the light-receiving unit is identical to the size of their de Broglie wavelength (about 10 nm) and any fabrication within the range similar thereto as well.

Figure 5:
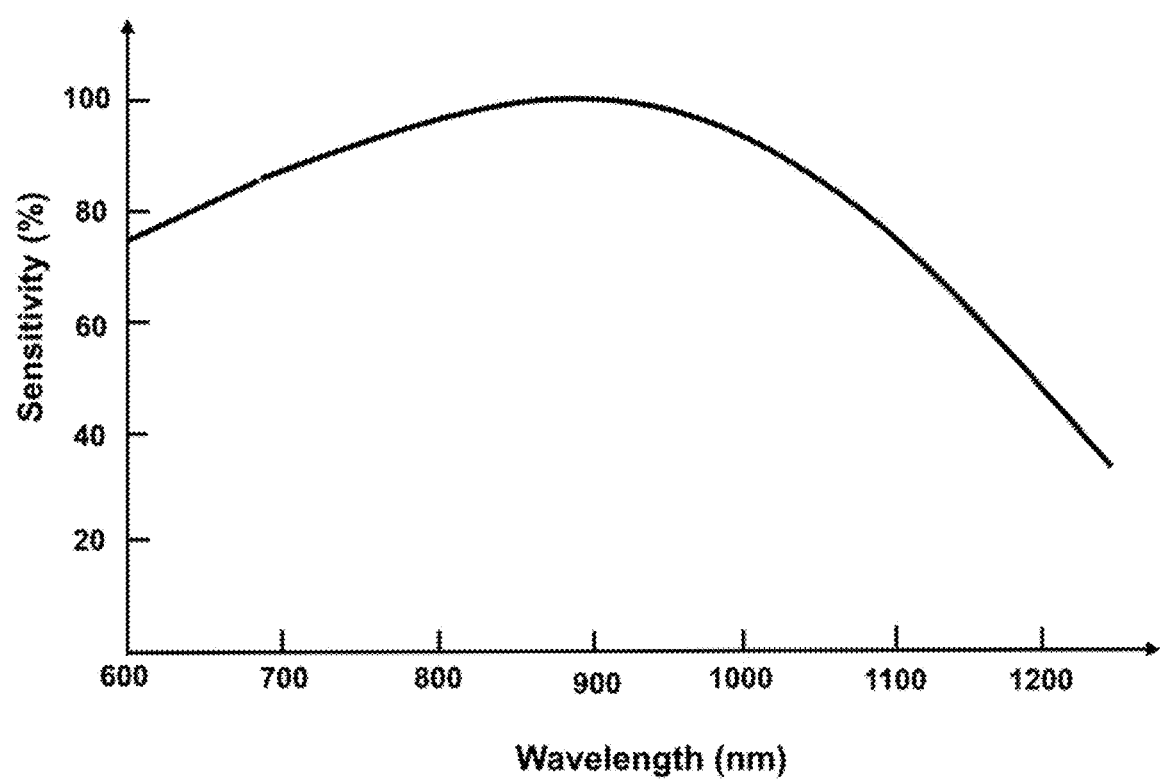
FIG. 5 is a graph which plots wavelength characteristics of the tunnel junction light-receiving element according to an embodiment of the present disclosure.

FIG. 5 is a graph which plots wavelength detection characteristics of the tunnel junction light-receiving element 100 according to an embodiment of the present disclosure. The image sensor of common silicon materials detects effective signals from 400 to 1,100 nm. On the contrary, the tunnel junction light-receiving element 100 according to an embodiment of the present disclosure has, as illustrated in FIG. 5, peak characteristics of 900 nm or more, based on a plurality of band gaps according to a plurality of local energy levels, and can detect effective signals at 1,200 nm or more.

Figure 6A:
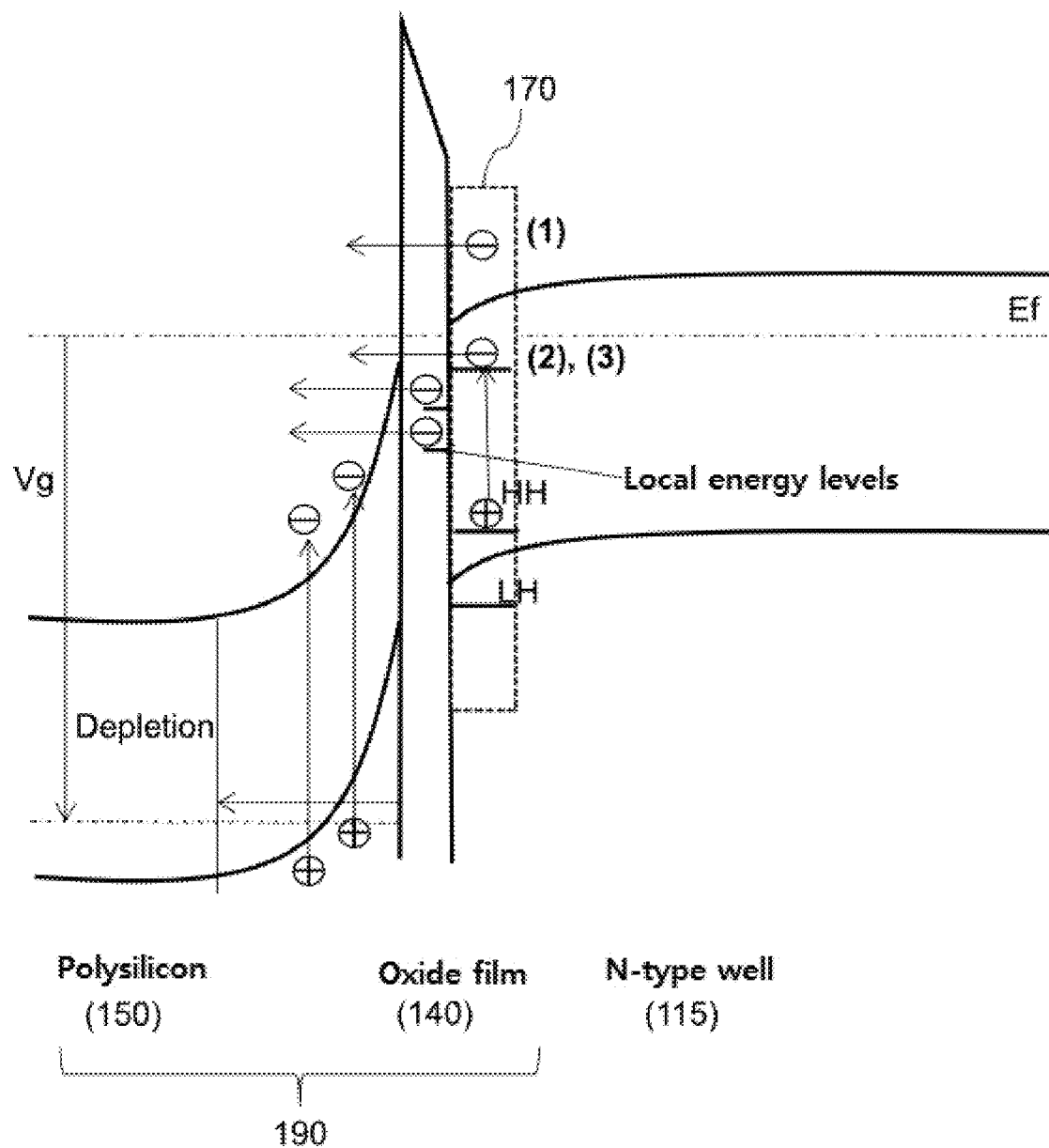
FIGS. 6a through 6c are energy band diagrams which illustrate change of operation as light enters the tunnel junction light-receiving element 100 according to an embodiment of the present disclosure.
Figure 6B:
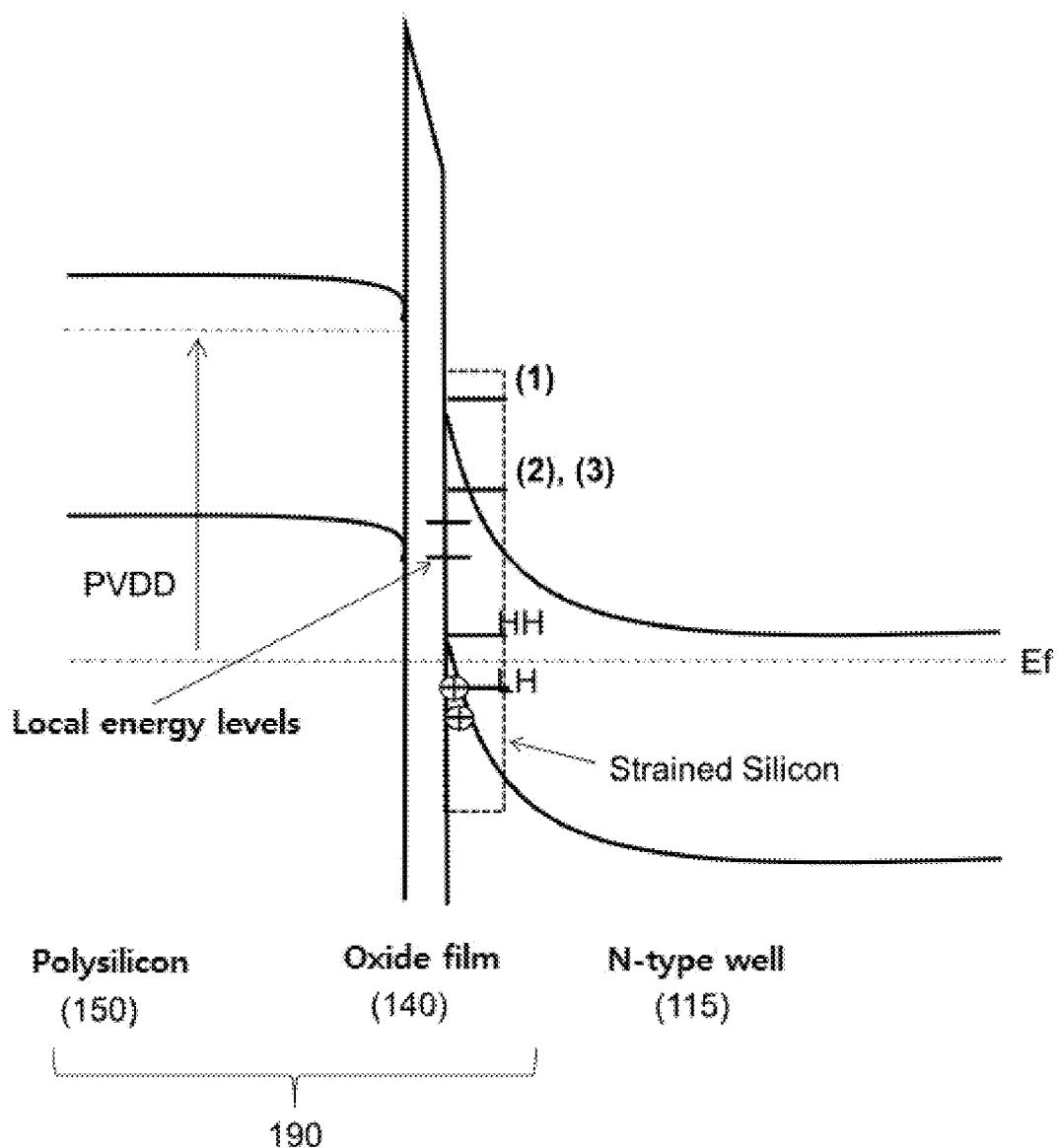
Figure 6C:
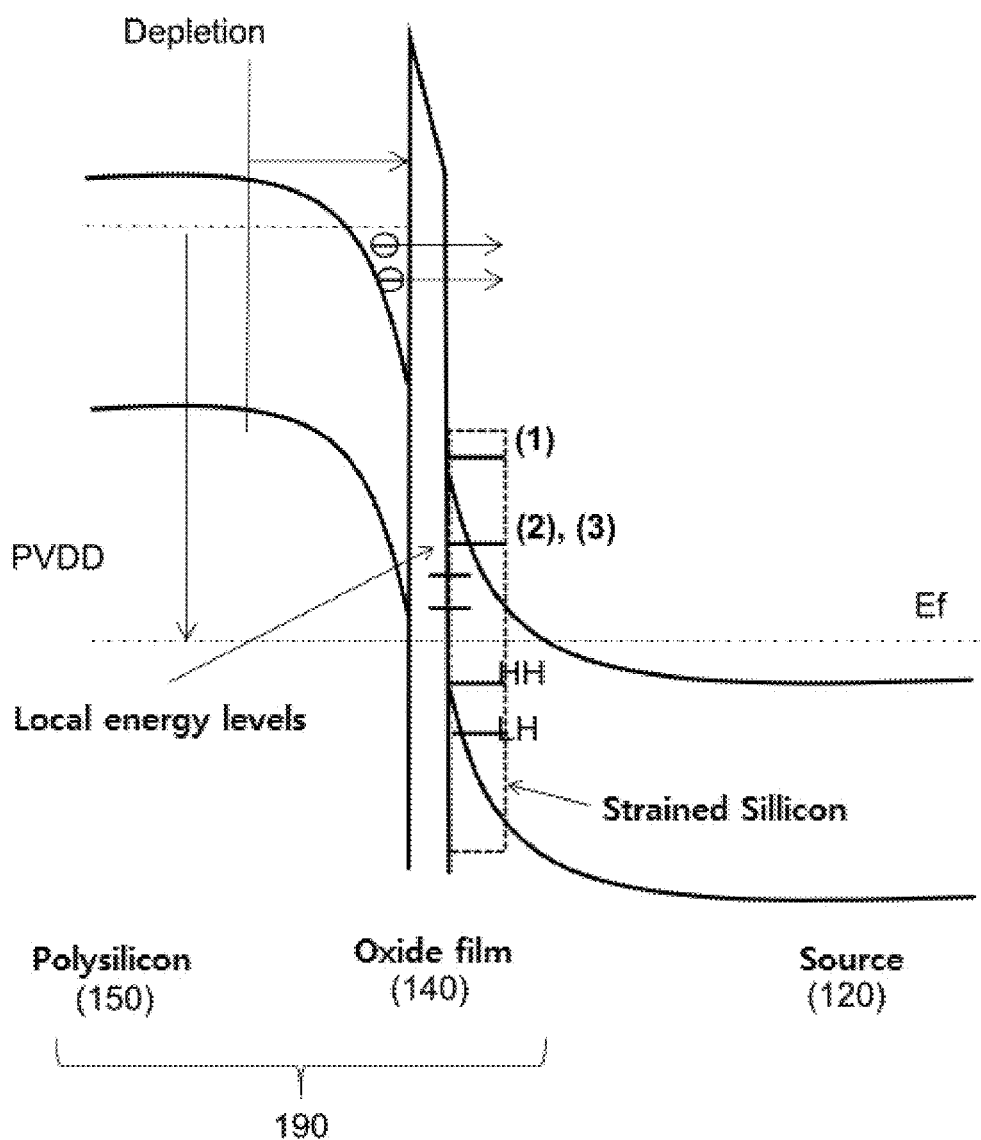

FIGS. 6a through 6c are energy band diagrams which illustrate change of operation as light enters the tunnel junction light-receiving element 100 according to an embodiment of the present disclosure. In FIGS. 6a through 6c, it is assumed the wavelength expanding layer is formed in the channel (or the interface of the N-type well).

When light enters EHPs are generated in the light-receiving layer 190 as illustrated in FIGS. 6a and 6b, wherein a plurality of local energy levels are generated in the channel where the wavelength expanding layer 170 is formed. When power supply voltage, VDD, is applied, such excited electrons tunnel through, driven by the electric field, the oxide film 140 in the channel 160, the drain 130 and the like to make the interface between the light-receiving unit 150 and the oxide film 140 depleted. When the interface is thus depleted by tunneling of electrons, the channel 160 is formed under the effect of threshold modulation according to change of charge quantity in the light-receiving unit 150.

After that, when light intensity is diminished or shut out, as illustrated in FIG. 6c, the electrons which have completed tunneling tunnel through the source 120 and the channel 160 again and charge quantity in the light-receiving unit 150 is restored to its original state. Accordingly, the formed depletion layer decreases and, at the same time, the photocurrent formed in the channel decreases.

However, after light is shut out, the excited electrons may not be removed altogether and can reside in the diffusion well (or the substrate of the N-type well 115 and the like) to make operational errors such as delayed signals. Therefore, the tunnel junction light-receiving element according to an embodiment of the present disclosure can further include the reset element to remove the residual electrons altogether.

Figure 7:
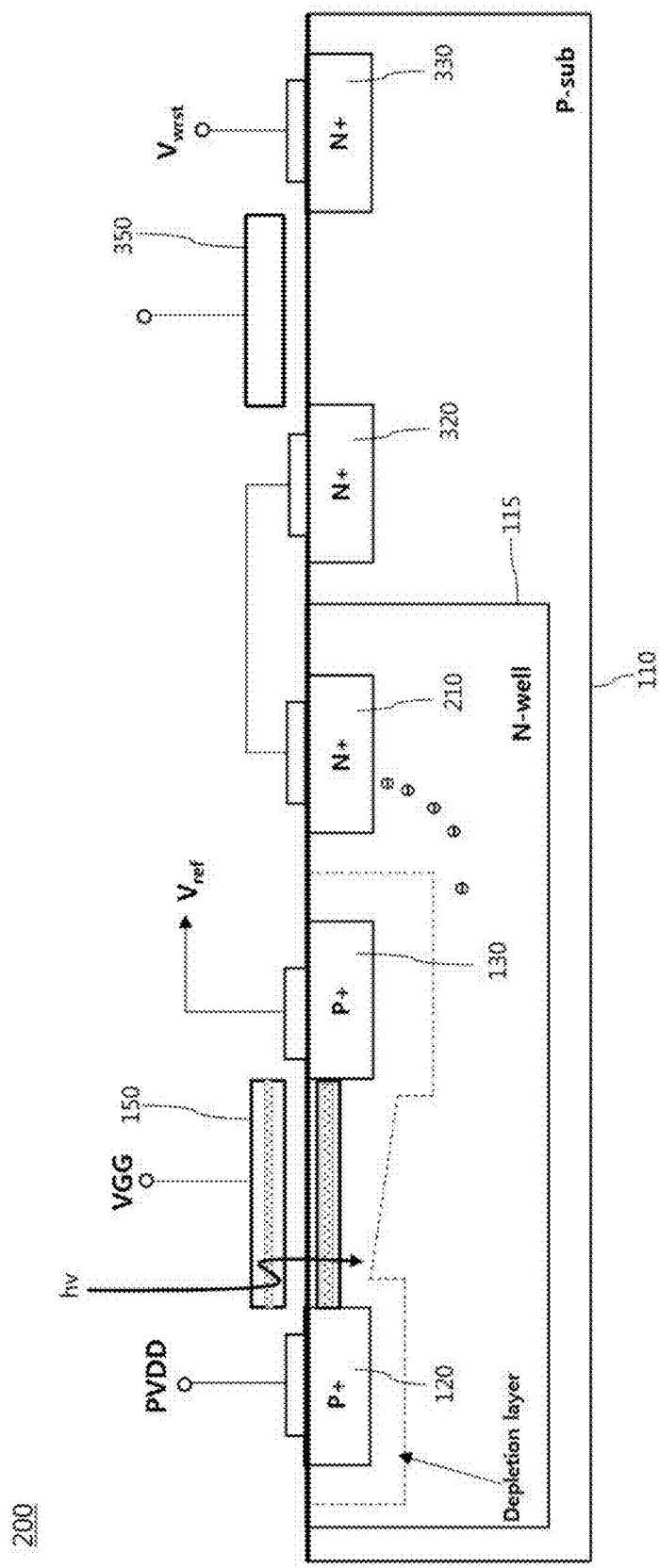
FIG. 7 is a cross-sectional view of the unit pixel using the tunnel junction light-receiving element according to an embodiment of the present disclosure.

FIG. 7 is a cross-sectional view of the unit pixel 200 using the tunnel junction light-receiving element 100 according to an embodiment of the present disclosure. In FIG. 7, the unit pixel 200 includes the tunnel junction light-receiving element 100 and the reset element 300 described with reference to FIGS. 1 through 4.

Here, the reset element 300 can be composed of various elements and formed by using existing MOSFET structures. In such cases, the N+ diffusion layer 210 is formed by injecting high-density N-type impurities onto the N-type well 115 of the tunnel junction light-receiving element 100 while the reset element 300 can be achieved through the existing MOSFET fabricating process.

According to an embodiment of the present disclosure, the reset element 300 can be achieved into an NMOS, wherein the source 320 of the reset element 300 is connected to the N+ diffusion layer 210 on the N-type well 115 while bias voltage(NW_BIAS) is applied to the drain 330 of the reset element 300. Here, the bias voltage of the reset element 300 can be used to remove the residual electrons in the N-type well 115 by toggling it, or switching it on and off, but is not limited thereto. As a nonrestrictive example, the VDD of the tunnel junction light-receiving element 100 is about 2.7 V, wherein the NW_BIAS of the reset element 300 is about from 2.2 to 2.7 V. When the NW_BIAS is applied to the drain 330 of the reset element 300, a certain amount of voltage is applied to the N-type well 115 of the tunnel junction light-receiving element 100 connected to the source 320 of the reset element 600 and the residual charges in the N-type well 115 are removed, initializing the tunnel junction light-receiving element 100.

According to an embodiment of the present disclosure, in the tunnel junction light-receiving element 100, signal characteristics can be controlled including sensor sensitivity, dynamic range, output signal linearity and the like by intentionally controlling gate voltage, VGG, through a terminal connected to the light-receiving unit 150. For example, when 0 V of the gate voltage is applied, a hole accumulation regime is formed in the silicon interface in the sense of potential because its Fermi level and intrinsic level are overlapped each other while a current flows constantly in the along the channel. In this state, the current flowing in the channel is composed mostly of a dark current. Therefore, light-receiving efficiency can be easily enhanced by applying 0 V or more of the gate voltage to the light-receiving unit 250 to decrease the dark current component and increase the signal current component generated by reaction with light.

Figure 8:
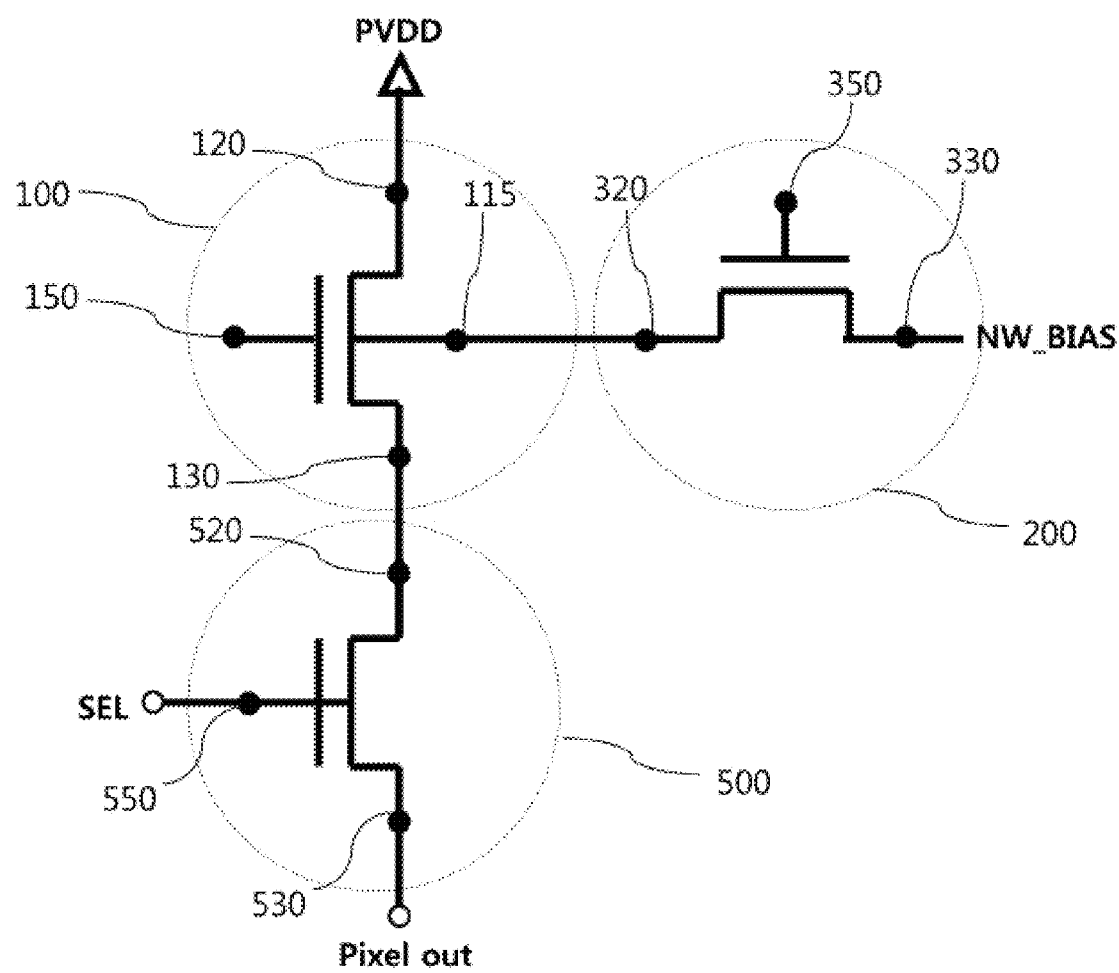
FIG. 8 illustrates a circuit diagram of the unit pixel using the tunnel junction light-receiving element according to an embodiment of the present disclosure.

FIG. 8 illustrates a circuit diagram of the unit pixel 400 using the tunnel junction light-receiving element 100 according to an embodiment of the present disclosure. The unit pixel 400 according to an embodiment of the present disclosure, as illustrated in FIG. 8, includes the tunnel junction light-receiving element 100, the reset element 300 and the selection element 500.

Like the reset element 300, the selection element 500 can be composed of various elements and formed by using the existing MOSFET structure. Therefore, fabrication costs can be reduced and fabrication processes can be simplified in that the tunnel junction light-receiving element 100, the reset element 300 and the selection element 500 included in a single piece of the unit pixel can be achieved through a single process of MOSFET fabrication.

The source 120 of the tunnel junction light-receiving element 100 is connected to the power supply voltage, VDD while the source 120 comes in contact with the source 320 of the selection element 500. Although the source 120 and the drain 130 of the tunnel junction light-receiving element 100 have a symmetrical structure and are identical to each other, the area which is connected to VDD or an external charge source is designated as source in this Specification and the scope of claims of the present disclosure. However, a person skilled in the art may easily understand the scope of rights of the present disclosure shall range up to the opposite case.

The source 520 of the selection element 500 is connected to the drain 130 of the tunnel junction light-receiving element 100 and the drain 530 is connected to the unit pixel out to switch on and off the output of the tunnel junction light-receiving element 100. Control signals (SEL) to switch on and off the selection element 500 are applied through the gate 550.

When the selection element 500 is in the unselected state or it is switched off, the unit pixel 400 is reset by the reset element 300. When the reset element 300 is completely initialized, the tunnel junction light-receiving element 100 is operated by operating the selection element 500. Because all the residual charges in the floated N-type well 115 are removed prior to operating the tunnel junction light-receiving element 100, dark current generation due to the residual charges can be prevented.

To the N-type well 115 is connected the source of the reset element 300. However, when the tunnel junction light-receiving element 100 is operating under the condition that reset is completed, in other words, when the selection element 500 is switched on, a photocurrent is not lost because this is equivalent to the condition that the N-type well is floated.

As described above, the tunnel junction light-receiving element 100 according to an embodiment of the present disclosure can generate hundreds to thousands of times of a photocurrent as compared with existing photodiodes from the same amount of light. More specifically, a photodiode distinguishes signal intensity only by the charge quantity accumulated in its electrostatic capacity. On the contrary, the tunnel junction light-receiving element 100 can control the current in the channel because change in the charge quantity by light in the light-receiving unit 150 causes an electric field. Moreover, signals are amplified in the light-receiving element itself because necessary charges are infinitely supplied through the channel and the drain. Therefore, the image sensor can be miniaturized without the necessity of designing an independent signal amplifying element.

Furthermore, the tunnel junction light-receiving element 100 according to an embodiment of the present disclosure can be applied in biometrics, motion recognition, three-dimensional object recognition and the like because it generates a plurality of local energy levels, thereby expanding the wavelengths from which effective signals can be detected. Meanwhile, although it is described above the tunnel junction light-receiving element 100 is achieved into the PMOS structure, it is obvious the element can have the NMOS structure. In addition, the tunnel junction light-receiving element 100 can have the light doped drain (LDD) structure. The light-receiving element 100 fabricated by the LDD process can reduce hot carrier generation due to the short channel effect.

Description thus far is nothing but exemplary and it should be understood a person skilled in the art can modify and change the present disclosure within the scope thereof. Embodiments in the present Specification are used just for describing the technical thoughts of the present disclosure and not for limiting them. The scope of the technical thoughts of the present disclosure should not be limited by such embodiments. Therefore, the scope of rights of the present disclosure should be construed by the scope of the Claims and all technical thoughts within the scope should be construed as included in the scope of rights of the present disclosure.

What is claimed is:

1. A unit pixel of an image sensor, comprising:
   a light-receiving element which generates an electric current by using change of electric charge quantity caused by incident light; and
   a reset element which removes residual electric charges from the light-receiving element,
   wherein the light-receiving element comprises:
      a light-receiving unit which is structured to be floated and absorbs light;
      a source and a drain which stand off the light-receiving unit with an oxide film in-between;
      a channel region formed between the source and the drain, and an electric current formed between the source and the drain; and
      a wavelength expanding layer which forms a plurality of local energy levels, and controls the electric current along the channel region based on change of electric charge quantity in the light-receiving unit, while electrons excited when light is received flow into the light-receiving unit under a tunneling effect when a local energy level condition of at least one of the plurality of local energy levels is met, and
   wherein the wavelength expending layer split the energy levels of the conduction band and the valence band according to the direction of a crystal lattice arrangement of the light-receiving unit.

2. The unit pixel of the image sensor of claim 1, wherein the reset element removes residual charges from a diffusion well where the light-receiving element is formed.

3. The unit pixel of the image sensor of claim 2, wherein the diffusion well remains floated while the light-receiving element operates.

4. The unit pixel of the image sensor of claim 2, wherein the reset element of the unit pixel of an image sensor is connected to a diffusion layer in which a first-type of impurities are doped in high density on the diffusion well in which the first-type of impurities are doped.

5. The unit pixel of the image sensor of claim 1, wherein the wavelength expanding layer comprises strained silicon.

6. The unit pixel of the image sensor of claim 1, wherein the light-receiving element comprises the light-receiving unit which corresponds to a de Broglie wavelength.

7. A unit pixel of an image sensor, comprising:
a light-receiving element which generates an electric current by using change of electric charge quantity caused by incident light;
a selection element which outputs the electric current generated in the light-receiving element to a unit pixel out; and
a reset element which removes residual electric charges from the light-receiving element,
wherein the light-receiving element comprises:
- a light-receiving unit which is structured to be floated and absorbs light;
- a source and a drain which stand off the light-receiving unit with a oxide film in between;
- a channel region which is formed between the source and the drain, and an electric current formed between the source and the drain; and
- a wavelength expanding layer which forms a plurality of local energy levels, and controls the electric current along the channel region based on change of electric charge quantity in the light-receiving unit while electrons excited when light is received flow into the light-receiving unit under a tunneling effect when a local energy level condition of at least one of the plurality of local energy levels is met, and wherein the wavelength expanding layer splits the energy levels of the conduction band and the valence band according to the direction of a crystal lattice arrangement of the light-receiving unit.

8. The unit pixel of the image sensor of claim 7, wherein the selection element comprises:
- a source and a drain which are connected to the light-receiving element and the unit pixel out, respectively; and
- a gate to which selection signals are applied from the outside, and performs switching operation on the basis of the applied selection signals.

9. The unit pixel of the image sensor of claim 7, wherein the wavelength expanding layer comprises strained silicon.

10. The unit pixel of the image sensor of claim 7, wherein the light-receiving element comprises the light-receiving unit which corresponds to a de Broglie wavelength.

* * * * *